(12) United States Patent
Sakai

(10) Patent No.: US 8,769,473 B1
(45) Date of Patent: Jul. 1, 2014

(54) WIRING DESIGN SUPPORT APPARATUS, METHOD AND COMPUTER-READABLE RECORDING MEDIUM

(71) Applicant: Fujitsu Limited, Kawasaki (JP)

(72) Inventor: Kazuhiro Sakai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/963,482

(22) Filed: Aug. 9, 2013

(30) Foreign Application Priority Data

Dec. 27, 2012 (JP) ................. 2012-285744

(51) Int. Cl.
*G06F 17/50* (2006.01)
(52) U.S. Cl.
CPC .................. *G06F 17/5068* (2013.01)
USPC .......................................... 716/137; 716/139
(58) Field of Classification Search
None
See application file for complete search history.

(56) References Cited

U.S. PATENT DOCUMENTS 7,575,442 B2 * 8/2009 Ogata et al. ................... 439/75

FOREIGN PATENT DOCUMENTS

| JP | 02003158381 A | * | 5/2003 |
| JP | 2008-129761 | | 6/2008 |
| JP | 2011-008664 | | 1/2011 |

* cited by examiner

*Primary Examiner* — Leigh Garbowski
(74) *Attorney, Agent, or Firm* — Fujitsu Patent Center

(57) ABSTRACT

A wiring design support apparatus includes: an input device with which input data about a wiring design content in a multilayered printed circuit board is input; a storage device includes a stab length limitation value table and a back drill application table stored therein, wherein the stab length limitation value table includes set data of a limitation value about a stab length of a through hole of the printed circuit board, and the back drill application table includes set data of information about whether a conductor of a stab of the printed circuit board can be removed or not; and a processor configured to determine, based on the stab length limitation value table and the back drill application table, whether a wiring design of the input data is appropriate.

11 Claims, 18 Drawing Sheets

| HIGH SPEED SIGNAL LEVEL | APPLICATION LAYER | THROUGH HOLE TYPE | | | |
|---|---|---|---|---|---|
| | | PF PIN HOLE | SMD LEAD VIA HOLE | INTER-LAYER CONNECTION VIA HOLE | IMD |
| A | NOT POSSIBLE | NOT POSSIBLE | NOT POSSIBLE | NOT POSSIBLE | – |
| B | MOUNTING BACK SIDE | POSSIBLE | NOT POSSIBLE | NOT POSSIBLE | – |
| C | MOUNTING SURFACE SIDE | – | POSSIBLE | POSSIBLE | – |
| | MOUNTING BACK SIDE | NECESSARY | POSSIBLE | POSSIBLE | – |

| HIGH SPEED SIGNAL LEVEL | LIMITATION NUMBER OF LAYERS |
|---|---|
| A | 5 |
| B | 3 |
| C | 2 |

FIG.2A

| No. | PART NAME | PART TYPE/SIZE | PART MOUNTING SURFACE | MOUNTING COORDINATE | MOUNTING ANGLE |
|---|---|---|---|---|---|
| 1 | CN1 | AAA | L1 SURFACE | 10mm,10mm | 0 |
| 2 | CN2 | DDD | L1 SURFACE | 10mm,100mm | 0 |
| 3 | IC1 | EEE | L1 SURFACE | 20mm,30mm | 90 |
| 4 | IC2 | FFF | L1 SURFACE | 70mm,30mm | 270 |
| 5 | IC3 | EEE | L6 SURFACE | 20mm,70mm | 180 |
| 6 | IC4 | FFF | L6 SURFACE | 70mm,70mm | 180 |
| 7 | R1 | BBB | L1 SURFACE | 50mm,50mm | 0 |

FIG.2B

| PART TYPE/SIZE | INSTALLATION TYPE |
|---|---|
| AAA | IMD |
| BBB | SMD |
| CCC | PRESS FIT |
| ... | ... |

FIG.3

| No. | NET NAME | HIGH SPEED SIGNAL LEVEL | CONNECTION DESTINATION 1 | CONNECTION DESTINATION 2 | CONNECTION DESTINATION 3 | CONNECTION DESTINATION 4 |
|---|---|---|---|---|---|---|
| 1 | 001 | C | CN1-002 | IC2-002 | | |
| 2 | 002 | – | IC3-001 | R1-1 | R2-2 | CN1-01 |
| 3 | 003 | A | IC4-B1 | CN2-A1 | | |

FIG.4

| Ln NUMBER | LAYER TYPE |
|---|---|
| 1 | SIGNAL |
| 2 | SIGNAL |
| 3 | POWER SUPPLY |
| 4 | EARTH |
| 5 | SIGNAL |
| 6 | SIGNAL |

FIG.5

| No. | HIGH SPEED SIGNAL LEVEL | SIGNAL SPEED LEVEL (COMMENT) |
|---|---|---|
| 1 | A | 800Mbps |
| 2 | B | 1.6Gbps |
| 3 | C | 3.2Gbps |

FIG.6

| HIGH SPEED SIGNAL LEVEL | APPLICATION LAYER | THROUGH HOLE TYPE | | | |
|---|---|---|---|---|---|
| | | PF PIN HOLE | SMD LEAD VIA HOLE | INTER-LAYER CONNECTION VIA HOLE | IMD |
| A | NOT POSSIBLE | NOT POSSIBLE | NOT POSSIBLE | NOT POSSIBLE | — |
| B | MOUNTING BACK SIDE | POSSIBLE | NOT POSSIBLE | NOT POSSIBLE | — |
| C | MOUNTING SURFACE SIDE | — | POSSIBLE | POSSIBLE | — |
| | MOUNTING BACK SIDE | NECESSARY | POSSIBLE | POSSIBLE | — |

FIG.7

| HIGH SPEED SIGNAL LEVEL | LIMITATION NUMBER OF LAYERS |
|---|---|
| A | 5 |
| B | 3 |
| C | 2 |

FIG.8

| THROUGH HOLE TYPE | PF PIN HOLE | SMD LEAD VIA HOLE | INTER-LAYER CONNECTION VIA HOLE | IMD |
|---|---|---|---|---|
| WIRING EFFECTIVE SURFACE | MOUNTING SURFACE SIDE OR MOUNTING BACK SIDE | MOUNTING BACK SIDE | BOTH SIDES | MOUNTING BACK SIDE |

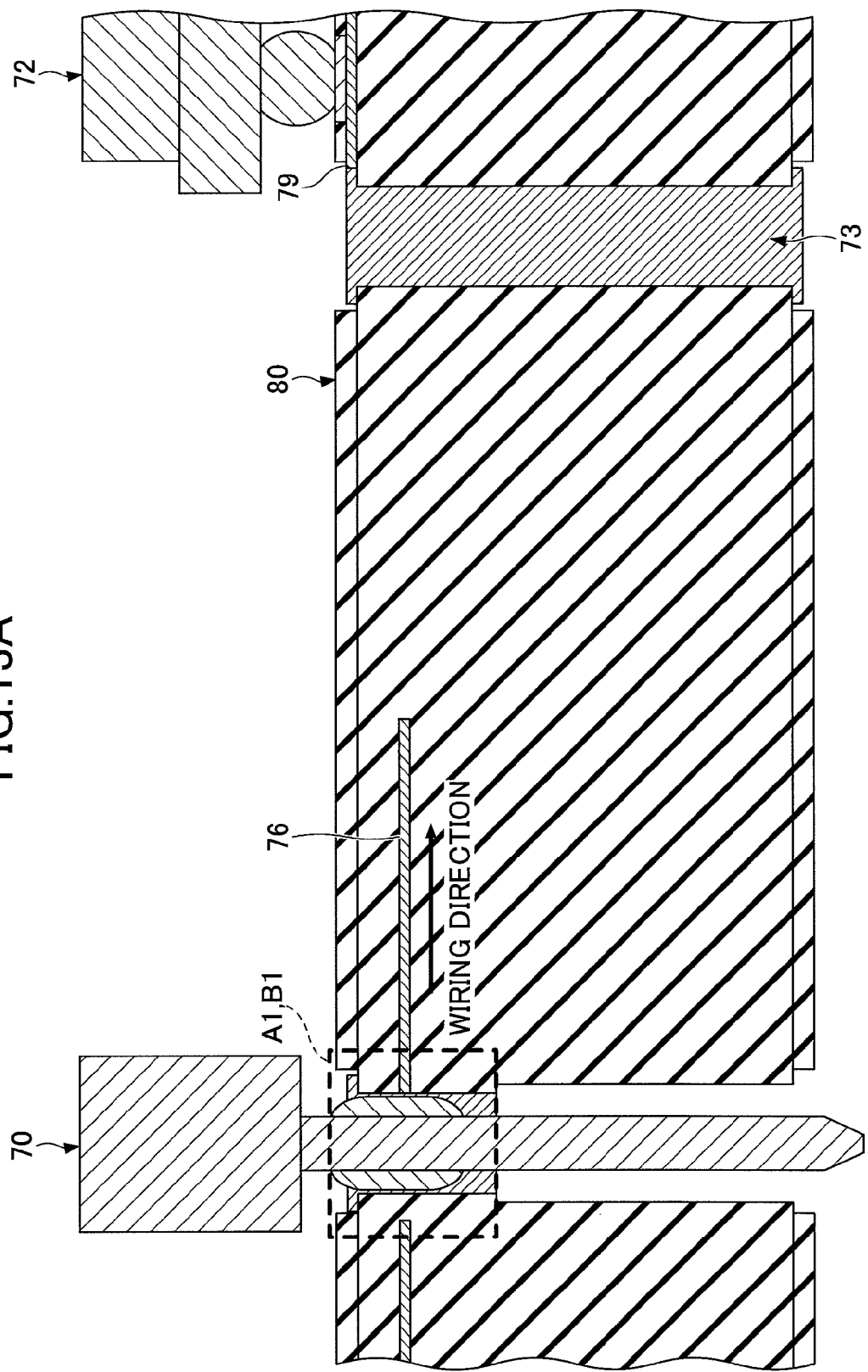

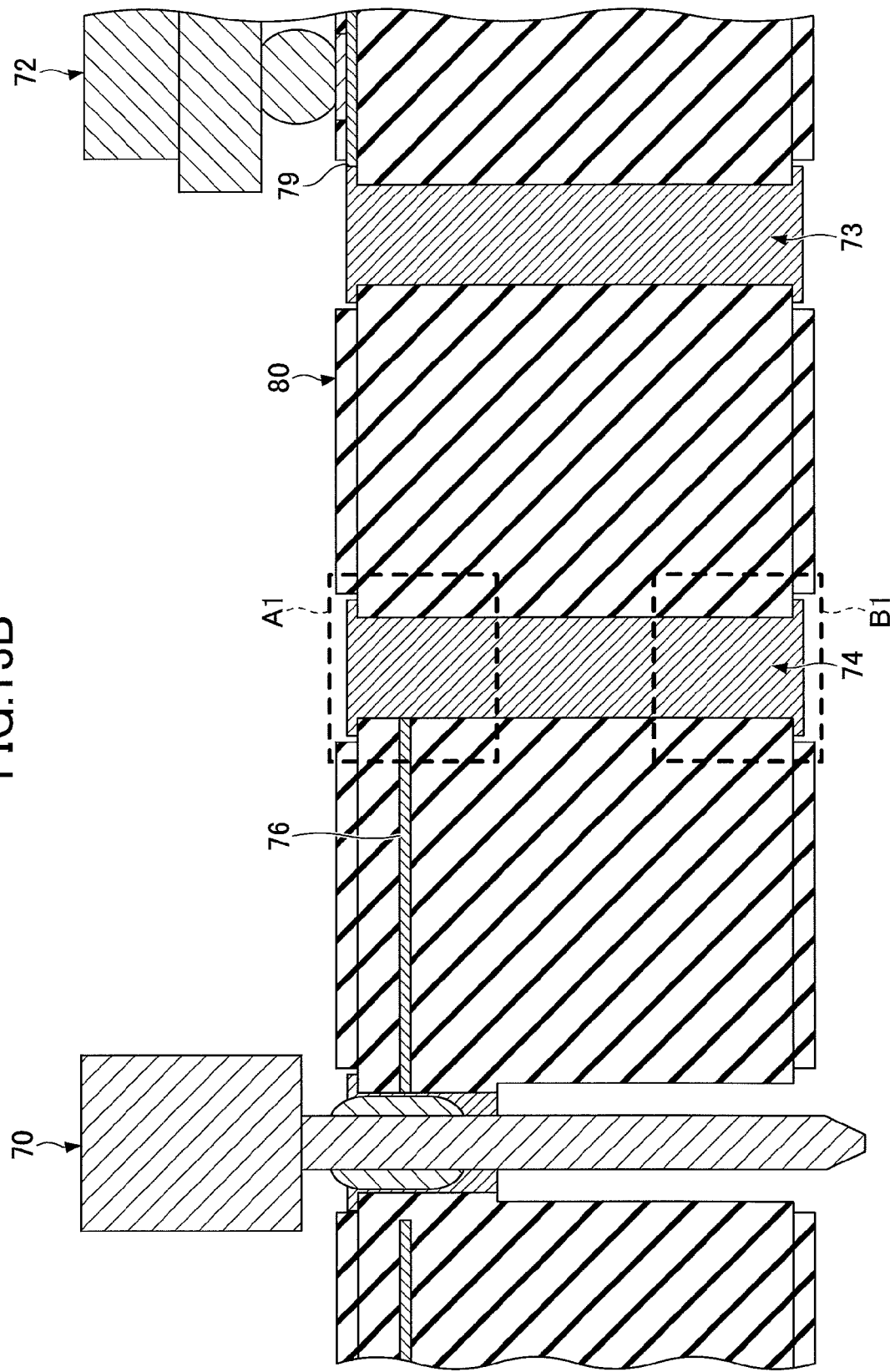

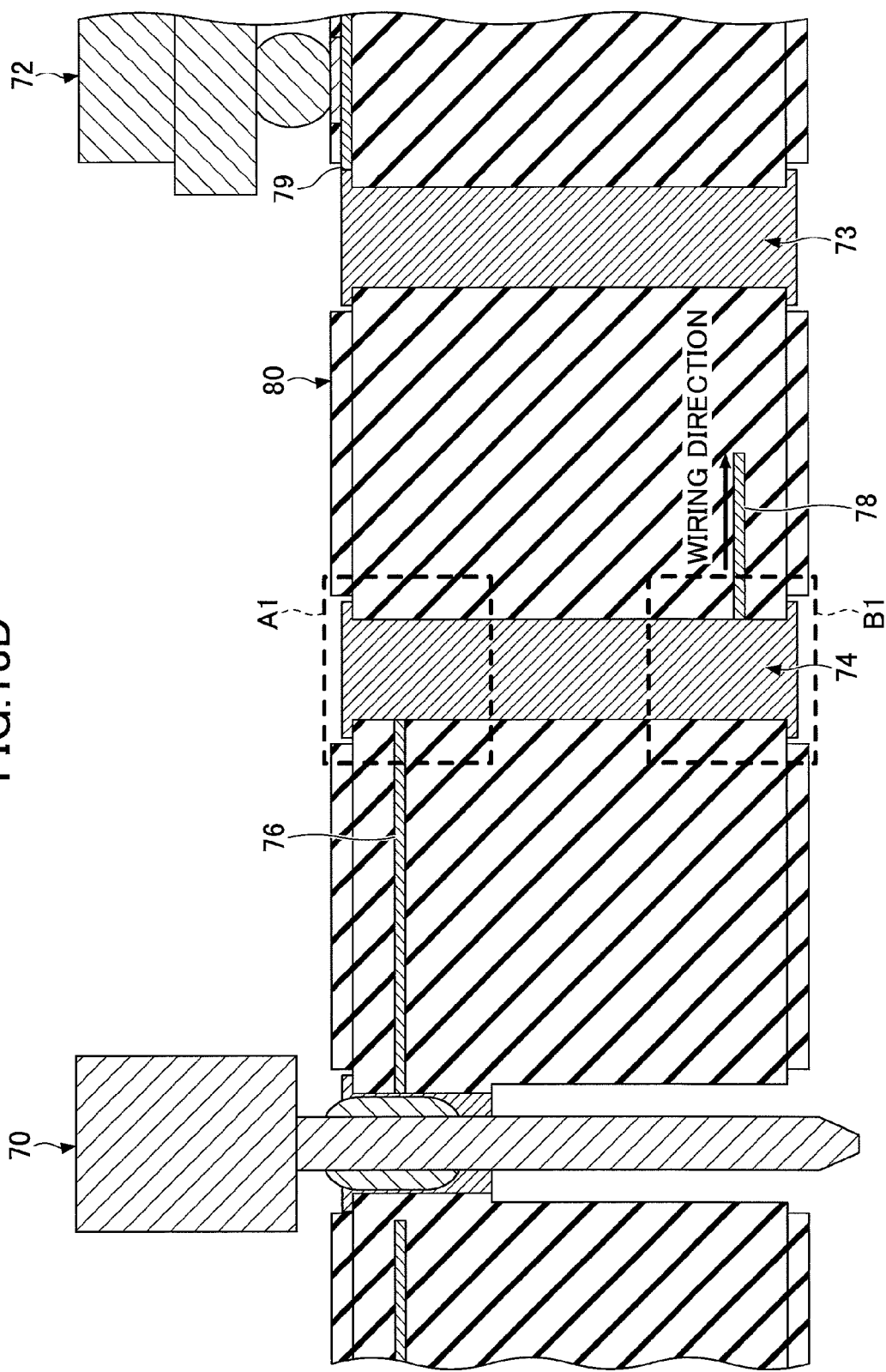

FIG.15A

| No. | LAYER | NET NAME | LINE WIDTH | LINE TYPE | STARTING POINT COORDINATE | END POINT COORDINATE | CENTER COORDINATE |
|---|---|---|---|---|---|---|---|
| 1 | L6 | 001 | 0.2mm | LINE | 12mm,10mm | 12mm,12mm | — |
| 2 | L6 | 001 | 0.2mm | LINE | 12mm,12mm | 14mm,12mm | — |
| 3 | L1 | 002 | 0.1mm | LINE | 38mm,43mm | 50mm,43mm | — |
| 4 | L3 | 008 | 0.15mm | LINE | 108mm,73mm | 108mm,45mm | — |
| 5 | L3 | 008 | 0.15mm | CIRCLE | 108mm,45mm | 106mm,43mm | 106mm,45mm |
| 6 | L5 | 001 | 0.2mm | LINE | 14mm,12mm | 20mm,12mm | — |

FIG.15B

| No. | NET NAME | LAND NAME | HOLE TYPE | COORDINATE | BACK DRILLING | | |
|---|---|---|---|---|---|---|---|
| | | | | | APPLIED OR NOT | COUNTER SINKING DIAMETER | COUNTER SINKING POSITION |
| 1 | 012 | LAND1 | THROUGH HOLE | 8mm,10mm | NOT APPLIED | – | – |
| 2 | 001 | LAND1 | THROUGH HOLE | 12mm,10mm | NOT APPLIED | – | – |
| 3 | 008 | LAND3 | FOOTPRINT | 10mm,20mm | – | – | – |
| 4 | 001 | LAND2 | THROUGH HOLE | 14mm,12mm | APPLIED | 1.8mm | L1–L4 |
| 5 | 002 | LAND1 | THROUGH HOLE | 11mm,11mm | NOT APPLIED | – | – |
| 6 | 008 | LAND7 | FOOTPRINT | 11mm,20mm | – | – | – |

FIG.16

| WIRING DESIGN CONTENT | LAYER IN QUESTION | BACK DRILLING APPLICABILITY | | BACK DRILLING APPLIED | | | THROUGH HOLE IN QUESTION HAS EXISTING CONNECTED WIRING | | CORRESPOND TO WIRING EFFECTIVE SURFACE |
|---|---|---|---|---|---|---|---|---|---|
| | | | BELOW LIMITATION LAYER NUMBER | | BELOW LIMITATION LAYER NUMBER | BELOW LIMITATION LAYER NUMBER AFTER BACK DRILLING | | WIRING LAYER OPPOSITE TO EXISTING CONNECTED WIRING | |
| LEADING WIRE FROM PIN 2 | L1,2 | NO | YES | – | – | – | NO | – | NO (ALARM) |
| | L3,4 | NO | NO (ALARM) | – | – | – | – | – | – |
| | L5 | NO | YES | – | – | – | NO | – | YES (NOT POSSIBLE DUE TO ADJACENT WIRING) |
| FORMING VIA HOLE AND HAVING WIRING LED THEREIN | L6 | NO | YES | – | – | – | NO | – | YES (COMPLETED) |
| | L1-4 | YES | – | NO | YES(L6) | – | NO | – | YES (COMPLETED) |
| LEADING WIRE FROM VIA HOLE | L1,2 | YES | – | NO | YES | – | YES | – | YES (NOT POSSIBLE DUE TO ADJACENT WIRING) |
| | L3-4 | YES | – | NO | NO (ALARM) | – | – | YES | – |
| | L5-6 | YES | – | NO | YES | – | YES | NO (ALARM) | – |
| ADDING BACK DRILLING | L1-4 | – | – | NO | YES | – | YES | – | YES (COMPLETED) |
| LEADING WIRE FROM VIA HOLE | L5 | YES | – | NO | YES | – | YES | YES | YES (COMPLETED) |

WIRING DESIGN SUPPORT APPARATUS, METHOD AND COMPUTER-READABLE RECORDING MEDIUM

CROSS-REFERENCE TO RELATED APPLICATIONS

This present application is based upon and claims the benefit of priority of the prior Japanese Patent Application No. 2012-285744, filed on Dec. 27, 2012, the entire contents of which are incorporated herein by reference.

FIELD

The embodiments discussed herein are related to a wiring design support apparatus, a method and a computer-readable recording medium.

BACKGROUND

A wiring layer determining system is known (see Japanese Laid-open Patent Publication No. 2008-129761, for example) which includes a storage device which stores storing parameters for calculating a permissible loss, a loss due to a through hole stab adapted for wiring layers, a loss due to a wiring length; and a processing device which reads the parameter data from the storage device, uses the parameter data to calculate, on a wiring basis and in predetermined order of the wiring layers, the loss due to a through hole stab adapted for wiring layers and the loss due to the wiring length, and determines the respective wiring layers based on the comparison result between the calculated losses and the permissible loss.

According to Japanese Laid-open Patent Publication No. 2008-129761, the wiring layer is determined such that removal of a conductor of the stab by a back drilling is not necessary; however, since a degree of flexibility of a wiring design may be increased if the removal of a conductor of the stab is applied, it is useful for engineering designers to grasp, at a design developing stage, whether the removal of a conductor of the stab can be applied.

SUMMARY

According to one aspect of the disclosure, a wiring design support apparatus is provided which includes: an input device with which input data about a wiring design content in a multilayered printed circuit board is input; a storage device includes a stab length limitation value table and a back drill application table stored therein, wherein the stab length limitation value table includes set data of a limitation value about a stab length of a through hole of the printed circuit board, and the back drill application table includes set data of information about whether a conductor of a stab of the printed circuit board can be removed or not; and a processor configured to determine, based on the stab length limitation value table and the back drill application table, whether a wiring design of the input data is appropriate.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 2A is a diagram for illustrating an example of a part arrangement information list 302.

FIG. 2B is a diagram for illustrating an example of a part library.

FIG. 3 is a diagram for illustrating an example of a net list in a net connection information list 304.

FIG. 4 is a diagram for illustrating an example of a layer configuration library 306.

FIG. 5 is a diagram for illustrating an example of a high speed signal level table 308.

FIG. 6 is a diagram for illustrating an example of a back drill application table 310.

FIG. 7 is a diagram for illustrating an example of a stab length limitation value table 312.

FIG. 8 is a diagram for illustrating an example of a wiring effective side table 314.

FIG. 13A is a diagram (No. 1) for illustrating an example of a design developing stage in the course of performing the wiring design illustrated in FIG. 12.

FIG. 13B is a diagram (No. 2) for illustrating an example of a design developing stage in the course of performing the wiring design illustrated in FIG. 12.

FIG. 13D is a diagram (No. 4) for illustrating an example of a design developing stage in the course of performing the wiring design illustrated in FIG. 12.

FIG. 15A is a diagram for illustrating an example of designed wiring information which is used and updated by the wiring design illustrated in FIG. 14.

FIG. 15B is a diagram for illustrating an example of designed land information which is used and updated by the wiring design illustrated in FIG. 14.

FIG. 16 is a diagram for illustrating a relationship between respective wiring design contents input at the time of wiring design illustrated in FIG. 14 and respective determination results in the wiring design support process illustrated in FIGS. 10 and 11.

DESCRIPTION OF EMBODIMENTS

In the following, embodiments will be described with reference to the accompanying drawings.

Figure 1:
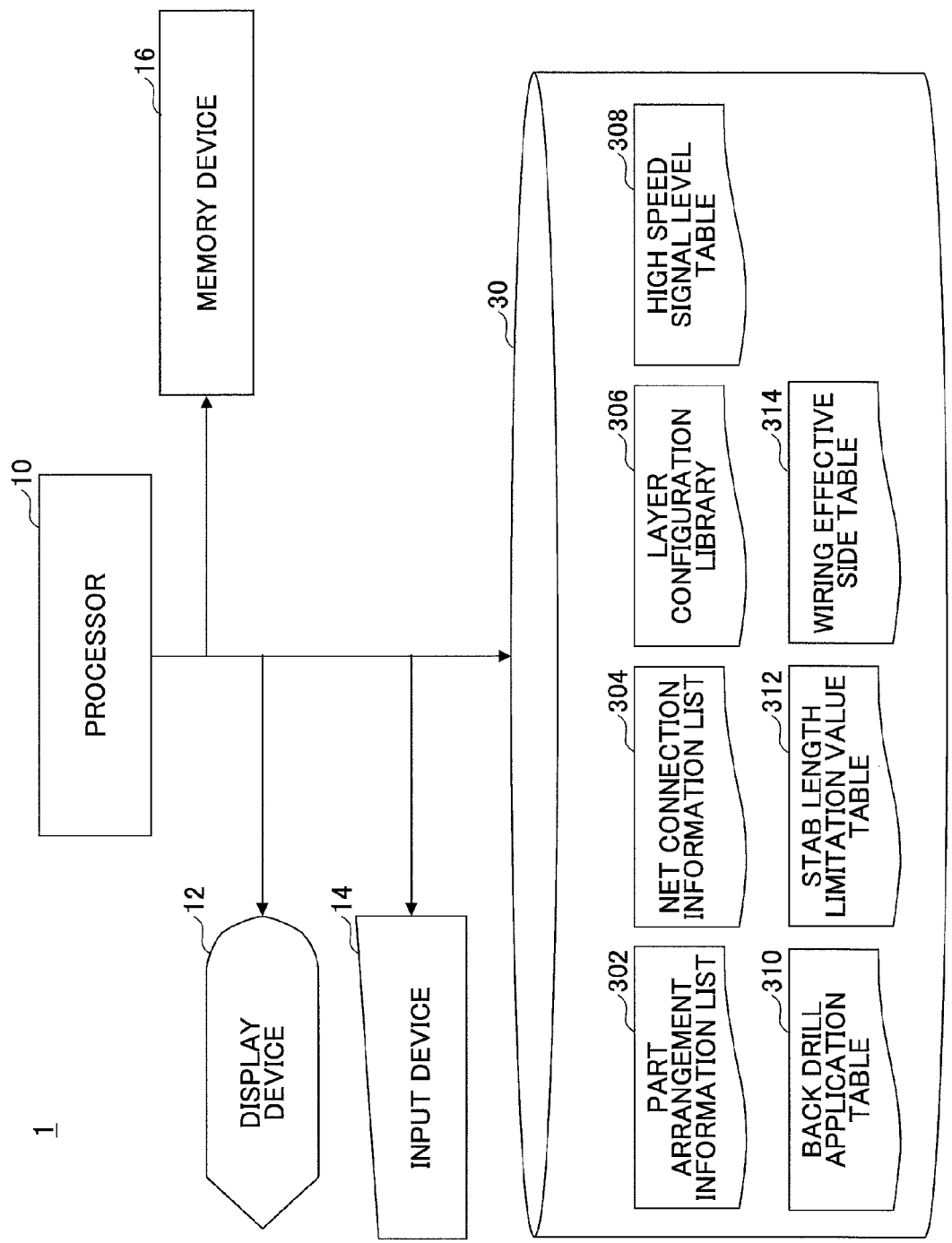
FIG. 1 is a diagram for schematically illustrating a configuration of a wiring design support apparatus 1 according to an embodiment.

FIG. 1 is a diagram for schematically illustrating a configuration of a wiring design support apparatus 1 according to an embodiment. The wiring design support apparatus 1 supports a wiring design for a multilayered printed circuit board.

The number of layers of the multilayered printed circuit board may be arbitrary.

The wiring design support apparatus 1 may be implemented by a computer. The wiring design support apparatus 1 includes, for example, a processor 10, a display device 12, an input device 14, a memory device 16, and a database 30, as illustrated in FIG. 1.

The processor 10 includes a CPU, for example. Functions of the processor 10 (including functions described hereinafter) may be implemented when the CPU executes a program(s) in the memory device 16, for example.

The display device 12 may be of any type such as a liquid crystal display.

The input device 14 may be of any type, including a keyboard including cursor keys, number keys and function keys, a mouse, a touch pad or the like.

The memory device 16 may be a ROM (Read-Only Memory), a RAM (Random Access Memory) or the like. In the memory device 16 are stored or temporarily stored programs and data, such as application software and an OS which is basic software the processor 10 executes.

The database 30 may be constructed by a auxiliary storage device such as HDD (Hard Disk Drive).

In the example illustrated in FIG. 1, the database 30 includes a part arrangement information list 302, a net connection information list 304, a layer configuration library 306, a high speed signal level table 308, a back drill application table 310, stab length limitation value table 312 and a wiring effective side table 314.

FIG. 2A is a diagram for illustrating an example of a part arrangement information list 302. In the example illustrated in FIG. 2A, the part arrangement information list 302 includes a part name, a part type/size, a part mounting surface, a mounting coordinate, and a mounting angle.

With respect to the part name, symbols such as CN, IC indicate a shape of a part, and a numeral number after the symbol CN such as CN1 indicates the number unique to the part. For example, when 100 parts, which are indicated by a symbol CN, are used, CN1 through CN100 are defined in the part arrangement information list 302. The mounting surface represents a surface on which the part is mounted. The part type/size represents symbols associated with a part library illustrated in FIG. 2B, and described hereinafter with reference to FIG. 2B. With respect to the mounting surface, a L1 surface and a L6 surface represents which surface of the printed circuit board the part is installed on. The L1 surface represents the front surface of the printed circuit board and the L6 surface represents the back surface of the printed circuit board. It is noted that the configuration of the layers is explained hereinafter with reference to the layer configuration library 306.

FIG. 2B is a diagram for illustrating an example of a part library. In the example illustrated in FIG. 2B, the part library includes an installation type associated with the symbols of the part type/size. The installation type includes an IMD (Insert Mount Device), a SMD (Surface Mount Device), a press fit (a part with a press fit lead), etc. It is noted that the part type/size may be associated with other information about a configuration of the mounting area related to the part shape, that is to say, a land configuration (a shape, a dimension, a drill diameter), etc.

FIG. 3 is a diagram for illustrating an example of a net list in a net connection information list 304. In the example illustrated in FIG. 3, the net list includes a net name, a high speed signal level and a connection destination.

The net name is a number unique to each net. It is noted that the term "net" represents a wiring between the connected parts. The unit of the net may be arbitrary. For example, a relationship may be such that one net may not be connected to another net. The high speed signal level represents a high speed signal level (a speed level of an electric signal) handled in the net. Contents of symbols "A", "B" and "C" of the high speed signal level are associated with the high speed signal level table 308. The connection destination represents a connection destination in the net. For example, the net of the net name "001" connects between a CN1-002 and an IC2-002. It is noted that the symbol preceding in the connection destination ("CN1" with respect to the CN1-002, for example) is given to identify the respective parts in the printed circuit board. In general, it is represented by a part type and an additional number on a type basis. For example, the "CN1" of the CN1-002 represents a first connector. The number after "-" in the connection destination ("002" with respect to the CN1-002, for example) represents the number of the pin. For example, with respect to the CN1-002, it represents a second pin of the first connector. It is noted that, in the illustrated example, the high speed signal level handled in the nets are classified into three categories "A", "B" and "C"; however, as a matter of course, it may be classified into two categories or more than three categories.

FIG. 4 is a diagram for illustrating an example of a layer configuration library 306. The layer configuration library 306 represents a layer configuration of the printed circuit board in question. In the example illustrated in FIG. 4, the layer configuration library 306 includes a Ln number and a layer type. The Ln number represents a position of the layer. In this example, the printed circuit board has a six-layered configuration wherein "1" represents the first layer from the front surface, and "6" represents the layer which is the closest to the back surface. The layer type represents an application purpose of the layer. "Signal" represents the layer for transferring the signal, "power supply" represents the layer for supplying power, and "earth" represents the layer for connecting to the ground. It is noted that, as a matter of course, the layer configuration library 306 may be set according to the layer configuration of the printed circuit board in question.

FIG. 5 is a diagram for illustrating an example of a high speed signal level table 308. The high speed signal level table 308 includes information about a signal speed which represents the contents of the symbols "A", "B" and "C" of the high speed signal level. It is noted that the numerical values of the signal speed are just information (comments) on the designer side and thus are not used in the process described hereinafter. Thus, the numerical values of the signal speed in the high speed signal level table 308 may be omitted.

FIG. 6 is a diagram for illustrating an example of a back drill application table 310. The back drill application table 310 includes set data of information about whether it is possible (or appropriate) to remove a conductor of a stab of the printed circuit board by back drilling. It is noted that back drilling is a technique for removing, with a drill, an excess portion of plating on the through hole from the front or back surface of the printed circuit board. It is noted that the excess portion of the plating on the through hole (i.e., the portion related to the stab length) causes reflection of signals and thus degradation in the quality of the signal (noise) or the like. Such degradation in the quality of the signal becomes more problematic as the high speed signal level becomes higher (i.e., the speed level to be handled becomes higher). Thus, in a preferred embodiment, the information about whether the conductor of the stab of the printed circuit board can be removed is set differently according to the high speed signal level. Further, the back drilling is subject to a physical constraint according to the attribute (type) of the through hole. For example, in the case of a PF (press fit) pin hole, the back drilling from the mounting surface side is physically impossible due to a shape of the fitting portion of the PF pin, and in the case of the IMD, the back drilling from the mounting surface side and the back side (mounting back side) is physically impossible due to the existence of the solder. Thus, in a preferred embodiment, the information about whether the conductor of the stab of the printed circuit board can be removed is set differently according to the type of the through hole.

In the example illustrated in FIG. 6, in the back drill application table 310 the information about whether the conductor of the stab of the printed circuit board can be removed is set according to a through hole type, which represents the type of the through hole, and the high speed signal level. The through hole type includes a PF pin hole, an SMD lead via hole, an inter-layer connection via hole, and an IMD. "Application layer" in the back drill application table 310 represents the side(s) from which the back drilling is applicable, which is one of or both of the front and back sides of the printed circuit board. With respect to the PF pin hole and the SMD lead via hole, the application layer differs according to the side (the front side or the back side) of the printed circuit board on which the part is installed. Thus, in the example illustrated in FIG. 6, the application layer is defined using the mounting side and the mounting back side. In is noted that, with respect to the inter-layer connection via hole, the part is not mounted therein. Thus, the mounting side and the mounting back side correspond to the front side and the back side of the printed circuit board, respectively.

The symbol "-" in the back drill application table 310 represents that the back drilling is physically impossible, and the "not possible" represents that the back drilling is not physically impossible but is not possible in terms of design requirements (cost, for example). Further, "necessary" represents that the back drilling is to be performed without any room for the designer's determination, and "possible" represents that the back drilling may be performed if the designer determines to do it. It is noted that the allocation of "not possible", "necessary" and "possible" is related to a balance between cost and signal quality, and thus it may be determined or changed according to design requirements, design concepts or the like, if appropriate. However, typically, if the high speed signal level becomes higher, "possible" or "necessary" tends to be set, because the degradation in the signal quality becomes more problematic as the high speed signal level becomes higher. It is noted that, in the example illustrated in FIG. 6, "possible" is set with respect to the mounting surface side related to the SMD lead via hole; however, there may be a case where "-" is set in terms of the physical restraint.

FIG. 7 is a diagram for illustrating an example of a stab length limitation value table 312. In the stab length limitation value table 312, a limitation value about a stab length of a through hole is set. The stab length may be a length of the excess portion of the plating on the through hole and measured in the extending direction of the through hole. The limitation value about the stab length may be a limitation value which the stab length should not exceed. In performing the wiring design for the high speed signal, it is necessary to reduce the reflection due to the stab length of the through hole, as described above. The acceptable level of the stab length of the through hole differs according to the high speed signal level. Thus, in a preferred embodiment, the limitation value about the stab length of the through hole is set differently according to the high speed signal level.

In the example illustrated in FIG. 7, the limitation value about the stab length of the through hole is defined as a limitation number of layers. It is noted that the limitation value about the stab length of the through hole may be defined using other physical quantities (length, for example). In the example illustrated in FIG. 7, the limitation value about the stab length of the through hole is set differently according to the high speed signal level. Specifically, the limitation value about the stab length of the through hole is set such that it becomes smaller as the high speed signal level becomes higher. In other words, the limitation value about the stab length of the through hole is set such that the limitation becomes more rigorous as the high speed signal level becomes higher. More specifically, the limitation number of layers for the high speed signal level "A" is "5", the limitation number of layers for the high speed signal level "B" is "3", and the limitation number of layers for the high speed signal level "C" is "2". It is noted that the limitation value about the stab length of the through hole may be changed, if appropriate, depending on the required signal quality or the like.

FIG. 8 is a diagram for illustrating an example of a wiring effective side table 314. In the wiring effective side table 314 is set information about which side (referred to as "wiring effective surface" hereinafter), among the front side and the back side of the printed circuit board, is effective for the wiring for the through hole. The wiring effective surface may be determined in terms of the physical constraint and noise reduction and differ according to the attribute (type) of the through hole. For example, in the case of the PF pin hole to which the back drilling has been applied, the wiring is possible (effective) only on the mounting surface side, and in the case of the IMD, the wiring is possible (effective) only on the mounting back side. Thus, in a preferred embodiment, the wiring effective surface is set differently according to the type of the through hole.

In the example illustrated in FIG. 8, in the wiring effective side table 314 the wiring effective surface is set according to the through hole type which represents the type of the through hole. The through hole type includes the PF pin hole, the SMD lead via, the inter-layer connection via, and the IMD, as is the case with the back drill application table 310 illustrated in FIG. 6. In the case of the PF pin hole, the wiring effective surface is the mounting surface side (in the case of the back drilling having been applied) or the mounting back side (in the case of the back drilling not applied). In the case of the SMD lead via hole, the wiring effective surface is only the mounting back side. In the case of the inter-layer connection via hole, the wiring effective surface is the front and back sides of the printed circuit board. In the case of the IMD, the wiring effective surface is only the mounting back side.

It is noted that in the case of the PF pin hole, as described above, the wiring effective surface is the mounting surface side in the case of the back drilling having been applied, and the wiring effective surface is the mounting back side in the case of the back drilling not applied. With respect to the PF pin hole, according to the example illustrated in FIG. 6, the information about whether the conductor of the stab of the printed circuit board can be removed is "necessary" for the high speed signal level "C", and thus it is premised that the back drilling is applied. Thus, in the case of the PF pin hole, the wiring effective surface may be set according to the high speed signal level.

Figure 9:
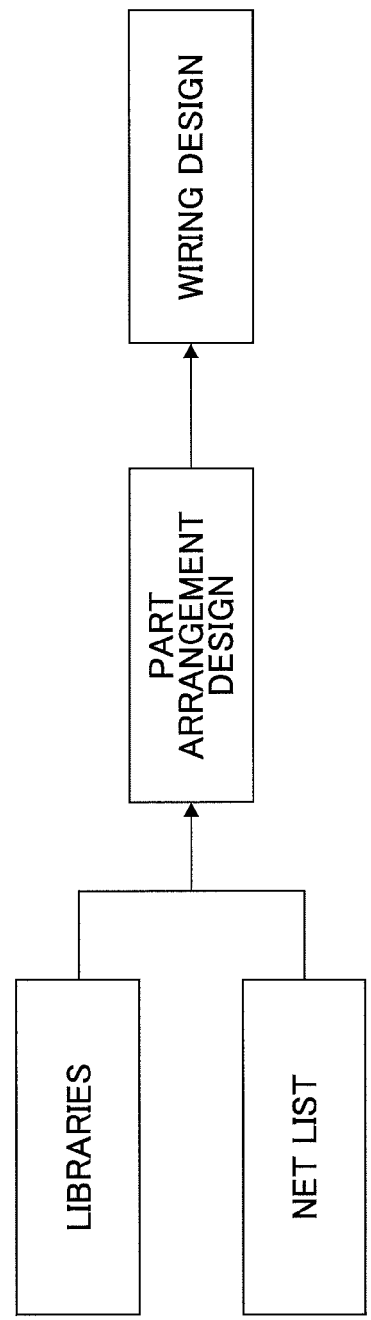
FIG. 9 is a diagram for illustrating an example of a flow until a wiring design.

FIG. 9 is a diagram for illustrating an example of a flow until a wiring design. The designer may make various libraries (see FIGS. 2B, 4, 6, 7 and 8) and the net list (see FIG. 3) at first and then perform a part arrangement design based on these items. Then, the part arrangement information list 302 (see FIG. 2A) may be generated by the part arrangement design. Next, the designer may perform a wiring design while he/she is supported by the wiring design support apparatus 1 based on the result of the part arrangement design. It is noted that the respective libraries may be made on a design target;

however, since the wiring effective side table 314 illustrated in FIG. 8, for example, has general versatility, it may be used for a plurality of the design targets.

Figure 10:
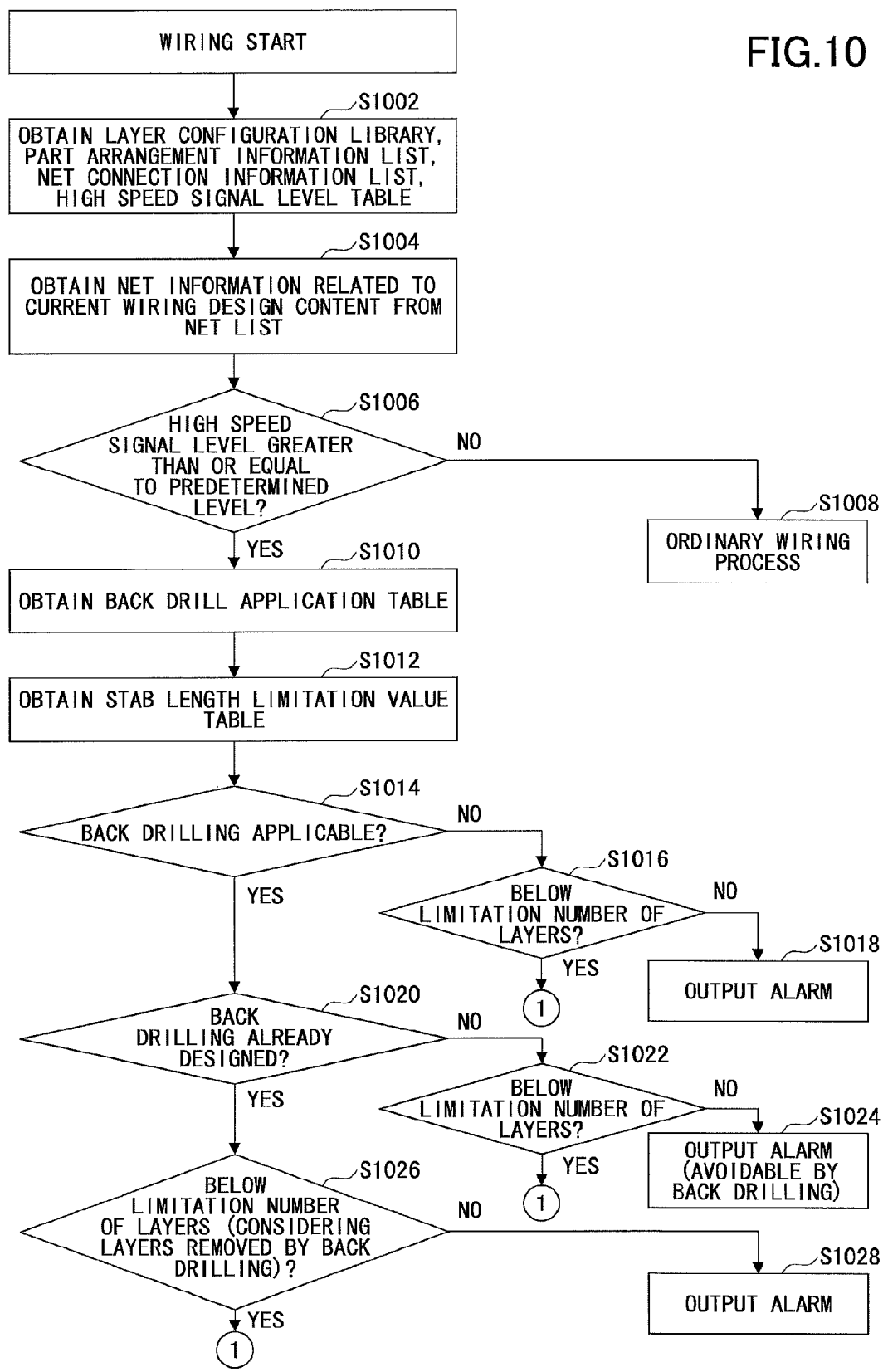
FIG. 10 is a flowchart (No. 1) for illustrating an example of a wiring design support process by a processor 10 of the wiring design support apparatus 1.
Figure 11:
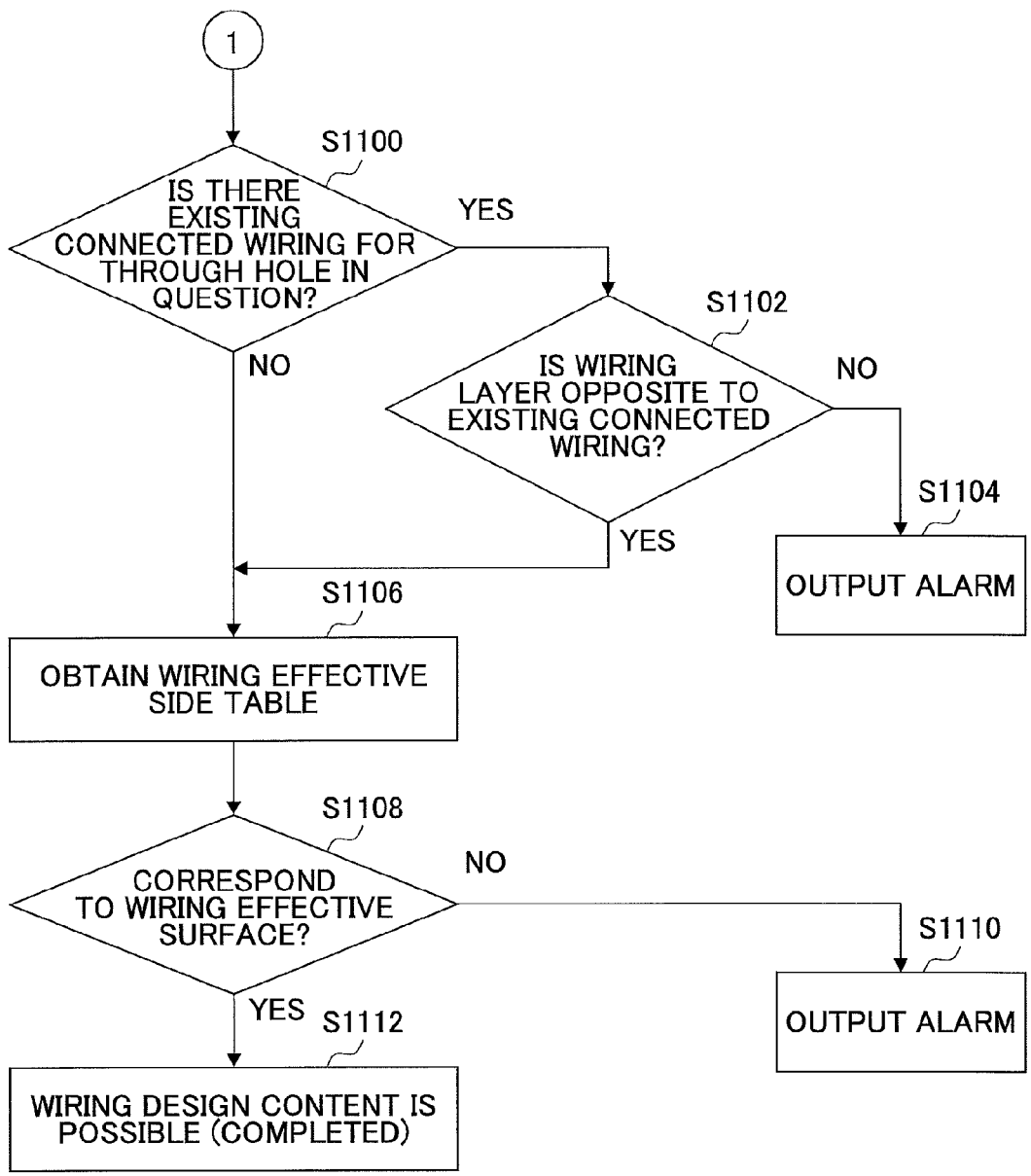
FIG. 11 is a flowchart (No. 2) for illustrating an example of a wiring design support process by the wiring design support apparatus 2.

FIG. 10 is a flowchart (No. 1) for illustrating an example of a wiring design support process by a processor 10 of the wiring design support apparatus 1. FIG. 11 is a flowchart (No. 2) which is continued from the wiring design support process illustrated in FIG. 10.

The wiring design support process illustrated in FIG. 10 is executed, when the input data, which represents the current wiring design content, is input through the input device 14, to determine whether the wiring design of the current wiring design content related to the input data is appropriate (or possible).

The wiring design content may not be a content of a combination of a plurality of the wiring design elements but a content of an individual wiring design element. The wiring design content may be leading a wiring from the through hole, leading a wiring into the through hole, forming an inter-layer connection via hole which involves leading the wiring, etc., for example. With respect to leading a wiring from the through hole, the wiring design content may include information about the through hole from which the wiring is led and information (Ln number) about the layer on which the wiring is formed. Further, with respect to leading a wiring into the through hole, the wiring design content may include information about the through hole into which the wiring is led and information (Ln number) about the layer on which the wiring is formed. Further, with respect to forming an inter-layer connection via hole which involves leading the wiring, the wiring design content may include information identifying the inter-layer connection via hole and information about the layer on which the wiring to be led into the inter-layer connection via hole is formed.

In step S1002, the layer configuration library 306, the part arrangement information list 302, the net connection information list 304 and the high speed signal level table 308 are obtained. It is noted that the high speed signal level table 308 may not be obtained.

In step S1004, the net information related to the current wiring design content is obtained based on the net connection information list 304. For example, if the current wiring design content is leading the wiring from the CN1-002, the net information related to the net name "001" (see FIG. 3) which has the CN1-002 therein is obtained.

In step S1006, it is determined, based on the net connection information list 304, whether the high speed signal level of the net related to the net information obtained in step S1004 is greater than or equal to a predetermined level. In other words, it is determined whether the high speed signal level handled in the net related to the current wiring design content is greater than or equal to the predetermined level. The predetermined level may be set as desired, and may be "B" (see FIG. 5), for example. If the high speed signal level of the net is greater than or equal to the predetermined level, the process goes to step S1010, otherwise the process goes to step S1008.

In step S1008, the process goes to an ordinary wiring process. In the ordinary wiring process the stab length is not considered. The explanation of the ordinary wiring process is omitted.

In step S1010, the back drill application table 310 is obtained.

In step S1012, the stab length limitation value table 312 is obtained.

In step S1014, it is determined, based on the back drill application table 310, whether the back drilling is applicable to the through hole related to the current wiring design content. Specifically, the type of the through hole related to the current wiring design content is identified, and the information about whether the back drilling is applicable is retrieved from the back drill application table 310 according to the identified type of the through hole and the high speed signal level of the net related to the current wiring design content. For example, if the current wiring design content is leading the wiring from the CN1-002 (or leading the wiring into the CN1-002), since the installation type of the CN1 is the IMD (see FIGS. 2A and 2B), the information about whether the back drilling is applicable with respect to the IMD is obtained from the back drill application table 310. Since the information about whether the back drilling is applicable with respect to the IMD is "-" (i.e., physically impossible) regardless of the high speed signal level of the net, the determination result of step S1014 becomes negative. It is noted that if the information about whether the back drilling is applicable is "not possible", the determination result of step S1014 may be negative, and if the information about whether the back drilling is applicable is "necessary" or "possible", the determination result of step S1014 may be affirmative. If the back drilling is applicable to the through hole related to the current wiring design content, the process goes to step S1020, otherwise the process goes to step S1016.

In step S1016, it is determined, based on the stab length limitation value table 312, whether the layer position of the wiring layer related to the current wiring design content is below the limitation number of the layers according to the high speed signal level related to the current wiring design content. Being below the limitation number of the layers may be a case where the layer position of the wiring layer related to the current wiring design content is below the limitation number of the layer from the front side of the printed circuit board, or the layer position of the wiring layer related to the current wiring design content is below the limitation number of the layer from the back side of the printed circuit board. In the following, for the sake of convenience, a range below the limitation number of the layer from the front side of the printed circuit board is referred to as "front side below-limitation layer number range", and a range below the limitation number of the layer from the back side of the printed circuit board is referred to as "back side below-limitation layer number range". For example, if the high speed signal level is "B", the limitation number of the layers according to the high speed signal level "B" is "3" (see FIG. 7). Thus, the front side below-limitation layer number range corresponds to a range including three layers (from the L1 layer to the L3 layer) from the front side of the printed circuit board, and the back side below-limitation layer number range corresponds to a range including three layers (from the L6 layer to the L4 layer) from the back side of the printed circuit board.

In step S1016, if the layer position of the wiring layer related to the current wiring design content is below the limitation number of the layers according to the high speed signal level related to the current wiring design content, that is to say, within the front side below-limitation layer number range or the back side below-limitation layer number range according to the high speed signal level related to the current wiring design content, the process goes to step S1100 in FIG. 11, otherwise the process goes to step S1018.

In step S1018, an alarm is output on the display device 12. It is noted that the alarm may be in other manners (a voice or the like, for example). The alarm may include a message to the effect that "the wiring of the current wiring design content is not possible because it exceeds the limitation value of the stab length".

In step S1020, it is determined, based on the latest designed information (see FIG. 15B), whether the application of the back drilling to the through hole related to the current wiring design content has already been designed. For example, if the application of the back drilling to the through hole related to the current wiring design content has already been designed by the design procedure which has been performed before the current wiring design content is input, the determination result of step S1020 is affirmative. If the application of the back drilling has already been designed with respect to the through hole related to the current wiring design content, the process goes to step S1026, otherwise the process goes to step S1022.

In step S1022, as is the case with step S1016 described above, it is determined, based on the stab length limitation value table 312, whether the layer position of the wiring layer related to the current wiring design content is below the limitation number of the layers according to the high speed signal level related to the current wiring design content. If the layer position of the wiring layer related to the current wiring design content is below the limitation number of the layers according to the high speed signal level related to the current wiring design content, the process goes to step S1100 in FIG. 11, otherwise the process goes to step S1024.

In step S1024, as is the case with step S1018 described above, an alarm is output on the display device 12. However, in a preferred embodiment, in step S1024, the processor 10 determines, based on the back drill application table 310, whether exceeding the limitation value of the stab length, which causes the alarm, is avoidable by removing the conductor of the stab by back drilling. Specifically, the processor 10 determines whether back drilling such that the layer position of the wiring layer related to the current wiring design content becomes within the front side below-limitation layer number range or the back side below-limitation layer number range is applicable. For example, if the high speed signal level is "B" and the L5 layer and the L6 layer is removable by back drilling, the back side below-limitation layer number range changes to a range from the L4 layer to the L2 layer. In this way, applying the back drilling leads to change in the front side below-limitation layer number range or the back side below-limitation layer number range, and thus may enable to avoid exceeding the limitation value of the stab length. If it is determined that exceeding the limitation value of the stab length is avoidable by removing the conductor of the stab by back drilling, such information is output on the display device 12. This output may also be output in any manner, and may involve outputting a voice or the like. For example, such information may be a message to the effect that "although the limitation value of the stab length is exceeded, it can be avoided by removing the conductor of the stab by back drilling". If the designer has designed the application of back drilling in response to such a message, the designed information is updated accordingly. In this case, when the process in FIG. 10 is performed in response to the next wiring design content, the determination result in step S1020 becomes affirmative.

In step S1026, it is determined, based on the stab length limitation value table 312, whether the layer position of the wiring layer related to the current wiring design content is below the limitation number of the layers which is updated by reducing (considering) the number of the layers which is to be removed by back drilling whose application has been designed. In other words, it is determined whether the layer position of the wiring layer related to the current wiring design content is within the front side below-limitation layer number range or the back side below-limitation layer number range after the application of back drilling. For example, if the high speed signal level is "B" and the L5 layer and the L6 layer is to be removed by the application of back drilling, the back side below-limitation layer number range changes to a range from the L4 layer to the L2 layer. In this case, the back side below-limitation layer number range is overlapped with the front side below-limitation layer number range. If the determination result in step S1026 is affirmative, the process goes to step S1100 in FIG. 11, otherwise the process goes to step S1028.

In step S1028, as is the case with step S1018 described above, the alarm is output on the display device 12.

Referring to FIG. 11, in step S1100, it is determined, based on the latest designed information (see FIGS. 15A and 15B), whether there is a wiring (referred to as "existing connected wiring", hereinafter) which has already been connected to the through hole related to the current wiring design content. If there is the existing connected wiring with respect to the through hole related to the current wiring design content, the process goes to step S1102, otherwise the process goes to step S1106.

In step S1102, it is determined whether the wiring related to the current wiring design content exists on the opposite side with respect to the existing connected wiring. In other words, it is determined whether the side (the front side or the back side of the printed circuit board) to which the wiring related to the current wiring design content belongs is opposite to the side to which the existing connected wiring belongs. In this case, with respect to the existing connected wiring, if the existing connected wiring is positioned within the front side below-limitation layer number range, the existing connected wiring is regarded as belonging to the "front side". On the other hand, if the existing connected wiring is positioned within the back side below-limitation layer number range, the existing connected wiring is regarded as belonging to the "back side". Similarly, with respect to the wiring related to the current wiring design content, if the wiring related to the current wiring design content is positioned within the front side below-limitation layer number range, the wiring related to the current wiring design content is regarded as belonging to the "front side". On the other hand, if the wiring related to the current wiring design content is positioned within the back side below-limitation layer number range, the wiring related to the current wiring design content is regarded as belonging to the "back side". However, the front side below-limitation layer number range may be overlapped with (or completely overlapped, that is to say, the same as) the back side below-limitation layer number range (if back drilling is applied, for example). In this case, if at least any one of the wiring related to the current wiring design content or the existing connected wiring is positioned within the overlapped range, it may be determined that the wiring related to the current wiring design content exists on the opposite side with respect to the existing connected wiring. If the determination result in step S1102 is affirmative, the process goes to step S1106, otherwise the process goes to step S1104.

In step S1104, as is the case with step S1018 described above, the alarm is output on the display device 12. The alarm may include a message to the effect that "the wiring of the current wiring design content is not possible because it causes to exceed the limitation value of the stab length in connection with the existing connected wiring".

In step S1106, the wiring effective side table 314 is obtained.

In step S1108, it is determined, based on the wiring effective side table 314, whether the wiring layer related to the current wiring design content corresponds to the wiring effective surface for the through hole related to the current wiring design content. For example, it is assumed that the wiring effective surface for the through hole related to the current wiring design content is "mounting surface side" and the "mounting surface side" corresponds to "front side" of the printed circuit board. In this case, if the wiring related to the current wiring design content is positioned within the front side below-limitation layer number range, the wiring layer related to the current wiring design content corresponds to the wiring effective surface. On the other hand, if the wiring related to the current wiring design content is not positioned within the front side below-limitation layer number range, the wiring layer related to the current wiring design content does not correspond to the wiring effective surface. If the determination result in step S1108 is affirmative, the process goes to step S1112, otherwise the process goes to step S1110.

In step S1110, the alarm is output on the display device 12. It is noted that the alarm may be in other manners (a voice or the like, for example). The alarm may include a message to the effect that "the wiring of the current wiring design content is not possible because the wiring layer does not correspond to the wiring effective surface".

In step S1112, it is determined that the wiring of the current wiring design content is possible. At that time, such information may be output on the display device 12. For example, if the designer performs a confirmation operation in response to the output information, the current wiring design content may be accepted and the designed information may be updated accordingly.

In this way, according to the wiring design support process illustrated in FIG. 10 and FIG. 11, whether the currently input wiring design content is appropriate is checked based on the back drill application table 310 and the stab length limitation value table 312. Thus, it is possible to support the wiring design which can comply with the stab length limitation value regardless of the presence or absence of the application of the back drilling. In particular, since whether the application of the back drilling is appropriate is checked based on the back drill application table 310, the flexibility of the wiring design can be increased.

Further, since the back drill application table 310 and the stab length limitation value table 312 are set according to the high speed signal level to be handled, it is possible to support the wiring design which can comply with the stab length limitation value while considering the factors which may be changed according to the high speed signal level, such as the limitation value of the stab length and whether it is possible to remove the conductor of the stab. In particular, since whether the application of the back drilling is appropriate is considered according to the high speed signal level based on the back drill application table 310, the flexibility of the design adapted to the high speed signal level can be implemented.

Further, since whether the currently input wiring design content is appropriate is checked based on the wiring effective side table 314, it is possible to detect inadequate wiring design in connection with the wiring effective surface to give feedback to the designer.

Further, since whether the currently input wiring design content is appropriate is checked while considering a relationship with the existing connected wiring, it is possible to detect inadequate wiring design, which is positioned within the front side below-limitation layer number range or the back side below-limitation layer number range but inadequate in terms of the relationship with the existing connected wiring, to give feedback to the designer.

Figure 12:
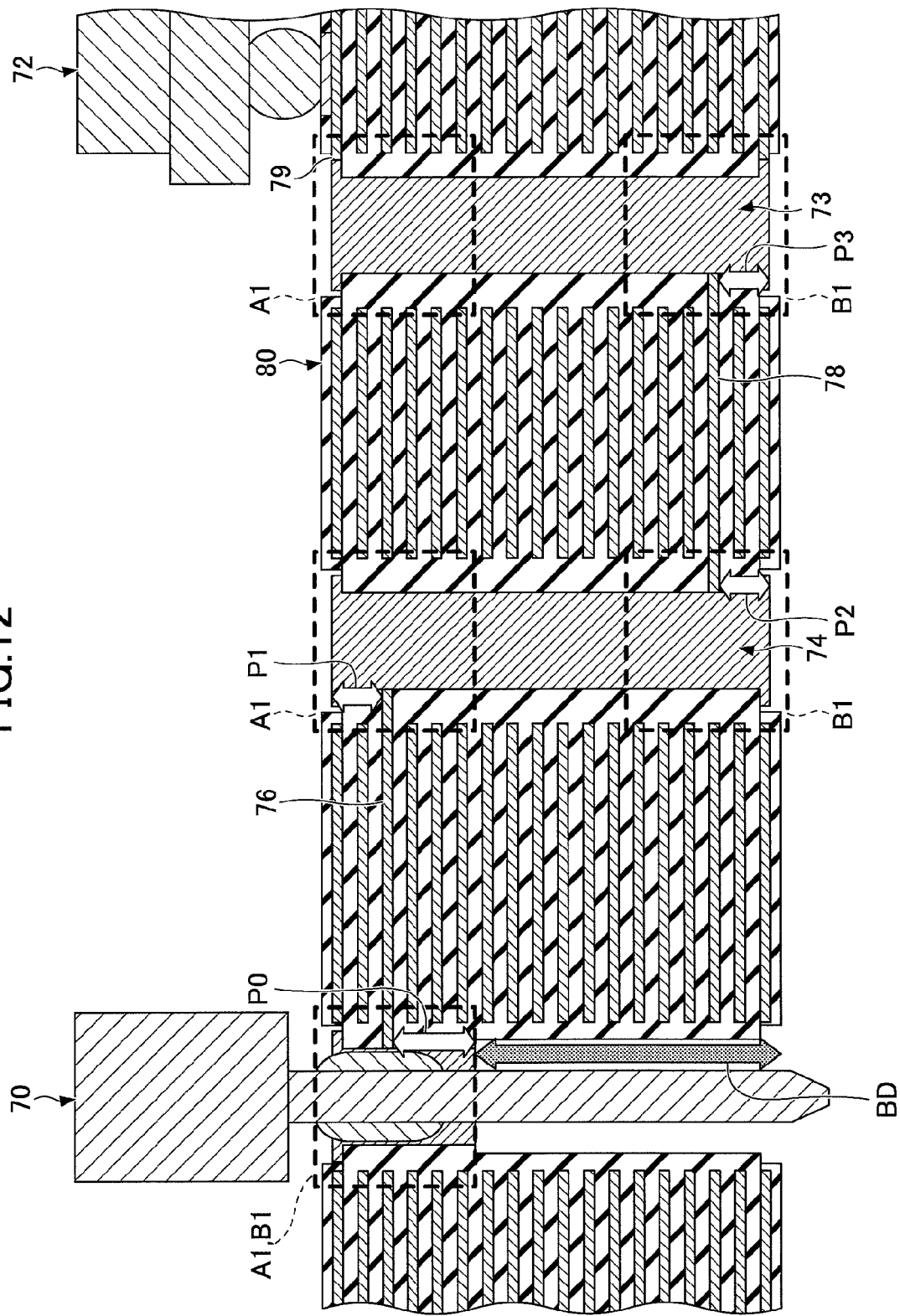
FIG. 12 is a diagram for illustrating an example of a wiring design.

FIG. 12 is a diagram for illustrating an example of a wiring design related to a certain net. In FIG. 12, an example of the wiring design related to a net which connects between a part having a PF pin 70 and a part 72 (LSI: Large-Scale Integration, for example) is illustrated. In the example illustrated in FIG. 12, the PF pin 70 is installed on the front side of a printed circuit board 80. The part 72 is installed on the front side of the printed circuit board 80. The back drill is applied to the PF pin hole related to the PF pin 70 from the back side of the printed circuit board 80. The number of the layers of the printed circuit board 80 is eighteen, and the back drill removes twelve layers from the back side of the printed circuit board 80, as indicated by an arrow BD. The part 72 is in a form of the SMD. A wiring 79 is formed on a front surface layer of the printed circuit board 80, and a SMD lead via hole 73 is formed to connect to the wiring 79.

In the example illustrated in FIG. 12, it is assumed that the limitation number of the layers according to the high speed signal level is six. Specifically, according to the stab length limitation value table 312 illustrated in FIG. 7, the limitation number of the layers according to the high speed signal level "B" is three; however, in the following example, for the sake of convenience for the explanation, it is assumed that the limitation number of the layers is six. Thus, a front side below-limitation layer number range A1 corresponds to a range of six layers from the front side of the printed circuit board 80, and a back side below-limitation layer number range B1 corresponds to a range of six layers from the back side of the printed circuit board 80. It is noted that the PF pin hole related to the PF pin 70 has twelve layers removed by back drilling, and thus with respect to the PF pin hole related to the PF pin 70 the front side below-limitation layer number range A1 is the same as (i.e., completely overlapped with) the back side below-limitation layer number range B1. In FIG. 12, the wiring 76 is led from the PF pin 70 using the L3 layer to be led into an inter-layer connection via hole 74. Thus, the stab length in the PF pin hole corresponds to the thickness of three layers as indicated by an arrow P0. The wiring 78 is led from the inter-layer connection via hole 74 to be led into a SMD lead via hole 73 using the L16 layer. Thus, the stab lengths in the inter-layer connection via hole 74 on the front side and the back side correspond to the thickness of two layers as indicated by arrows P1 and P2. Further, the stab length in a SMD lead via hole 73 corresponds to the thickness of two layers as indicated by an arrow P3.

Here, with reference to FIGS. 13A through 13E, a support manner implemented by the wiring design support process illustrated in FIGS. 10 and 11 in performing the wiring design illustrated in FIG. 12 is schematically described.

FIG. 13A is a diagram (No. 1) for illustrating an example of a design developing stage in the course of performing the wiring design of the net illustrated in FIG. 12. In FIG. 13A, for the sake of convenience for better understanding, illustration of irreverent layers of the printed circuit board 80 is omitted: however, the printed circuit board 80 has 18 layers, as in FIG. 12. At the design developing stage illustrated in FIG. 13A, the part with the PF pin 70 and the part 72 have already been installed, the back drilling has been applied to the PF pin hole related to PF pin 70, and the SMD lead via hole 73 has been formed.

A wiring design content this time is "leading a wiring from the PF pin hole related to PF pin 70 using the L3 layer". When the wiring design support process illustrated in FIGS. 10 and 11 in response to the input of this wiring design content, the result thereof is as follows. In this example, as described above, it is assumed that the high speed signal level associated with the net related to the current wiring design content is "B" and the number of the limitation layer according to the high speed signal level "B" is six. Thus, the determination result in step S1006 is affirmative. Then, the determination result in step S1014 is affirmative (because of "possible" as illustrated in FIG. 6), the determination result in step S1020 is affirmative (because the application of the back drilling has already been designed), and the determination result in step S1026 is affirmative (because the L3 layer is within the front side below-limitation layer number range A1). Then, the determination result in step S1100 is negative (because there is no existing connected wiring), the determination result in step S1108 is affirmative (because the wiring side corresponds to the wiring effective surface), and the current wiring design content is accepted (step S1112). In this way, leading the wiring 76 from the PF pin hole related to PF pin 70 has been designed (completed).

FIG. 13B is a diagram (No. 2) for illustrating an example of a design developing stage in the course of performing the wiring design illustrated in FIG. 12. The design developing stage corresponds to a stage after the wiring design content illustrated in FIG. 13A has been accepted.

A wiring design content this time is "forming the inter-layer connection via hole 74 to have the wiring 76 from the PF pin hole related to PF pin 70 led therein". In fact, other information about a position, a shape, etc., of the inter-layer connection via hole 74 may be input. When the wiring design support process illustrated in FIGS. 10 and 11 in response to the input of this wiring design content, the result thereof is as follows.

The determination result in step S1006 is affirmative (because of the high speed signal level "B"), the determination result in step S1014 is negative (because of "not possible" for the inter-layer connection via hole at the high speed signal level "B" as illustrated in FIG. 6), and the determination result in step S1016 is affirmative (because the L3 layer, which is the wiring layer, is within the front side below-limitation layer number range A1). Then, the determination result in step S1100 is negative (because there is no existing connected wiring), the determination result in step S1108 is affirmative (because any sides can be the wiring effective surface for the inter-layer connection via hole), and the current wiring design content is accepted (step S1112). In this way, the inter-layer connection via hole 74 having the wiring from the PF pin hole related to PF pin 70 led therein has been designed (completed).

It is noted that in the example illustrated in FIG. 13B, the wiring 76 is led into the inter-layer connection via hole 74 after having formed the inter-layer connection via hole 74; however, the relationship of the connection between the through hole and the wiring is the same even if the wiring 76 is led to a position where the inter-layer connection via hole 74 to be formed and then the inter-layer connection via hole 74 is formed. Thus, even in this case, when the wiring design support process illustrated in FIGS. 10 and 11 is performed, the results of the respective steps are the same as those in the case of forming the inter-layer connection via hole 74 first.

Figure 13C:
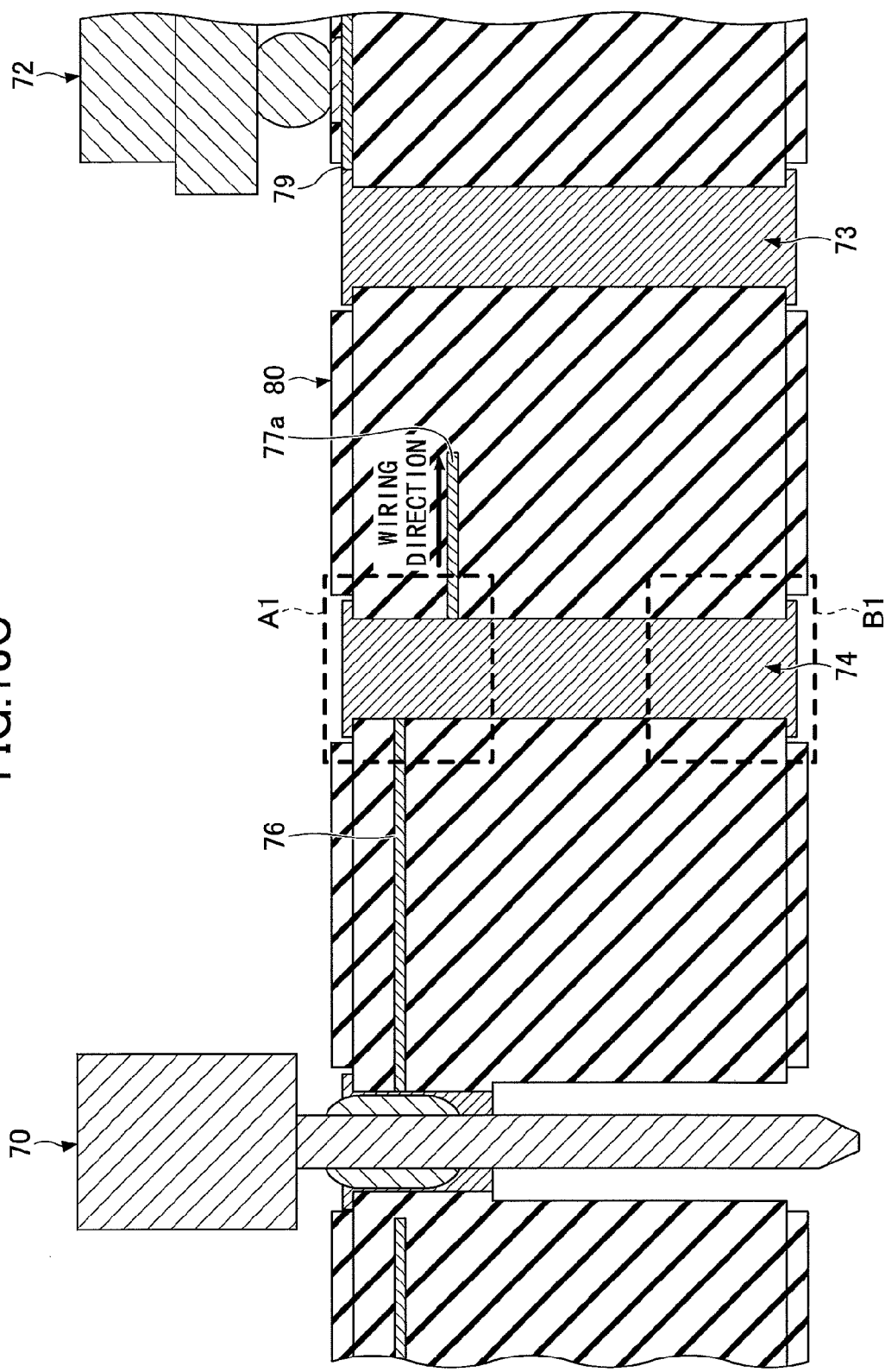
FIG. 13C is a diagram (No. 3) for illustrating an example of a design developing stage in the course of performing the wiring design illustrated in FIG. 12.

FIG. 13C is a diagram (No. 3) for illustrating an example of a design developing stage in the course of performing the wiring design illustrated in FIG. 12. The design developing stage corresponds to a stage after the wiring design content illustrated in FIG. 13B has been accepted.

A wiring design content this time is "leading a wiring 77a from the inter-layer connection via hole 74 using the L5 layer". When the wiring design support process illustrated in FIGS. 10 and 11 in response to the input of this wiring design content, the result thereof is as follows. The determination result in step S1006 is affirmative (because of the high speed signal level "B"), the determination result in step S1014 is negative (because of "not possible" for the inter-layer connection via hole at the high speed signal level "B" as illustrated in FIG. 6), and the determination result in step S1016 is affirmative (because the L5 layer, which is the wiring layer, is within the front side below-limitation layer number range A1). Then, the determination result in step S1100 is affirmative (because there is the wiring 76 as an existing connected wiring), and the determination result in step S1102 is negative (because the wiring 77a does not exist on the opposite side with respect to the wiring 76). Thus, the alarm is output (step S1104), and the current wiring design content is rejected. In this way, if the layer on which the wiring 77a is to be formed is inadequate in terms of the relationship with the existing connected wiring even though it is within the front side below-limitation layer number range, it is possible to inform the designer as feedback that the current wiring design content is inadequate.

FIG. 13D is a diagram (No. 4) for illustrating an example of a design developing stage in the course of performing the wiring design illustrated in FIG. 12. The design developing stage corresponds to a stage after the wiring design content illustrated in FIG. 13B has been accepted.

A wiring design content this time is "leading a wiring 78 from the inter-layer connection via hole 74 using the L16 layer". When the wiring design support process illustrated in FIGS. 10 and 11 in response to the input of this wiring design content, the result thereof is as follows. The determination result in step S1006 is affirmative (because of the high speed signal level "B"), the determination result in step S1014 is negative (because of "not possible" for the inter-layer connection via hole at the high speed signal level "B" as illustrated in FIG. 6), and the determination result in step S1016 is affirmative (because the L16 layer, which is the wiring layer, is within the back side below-limitation layer number range B1). Then, the determination result in step S1100 is affirmative (because there is the wiring 76 as an existing connected wiring), the determination result in step S1102 is affirmative (because the wiring 78 exists on the opposite side with respect to the wiring 76), the determination result in step S1108 is affirmative (because any sides can be the wiring effective surface for the inter-layer connection via hole), and the current wiring design content is accepted (step S1112). In this way, leading the wiring 78 from the inter-layer connection via hole 74 has been designed (completed).

Figure 13E:
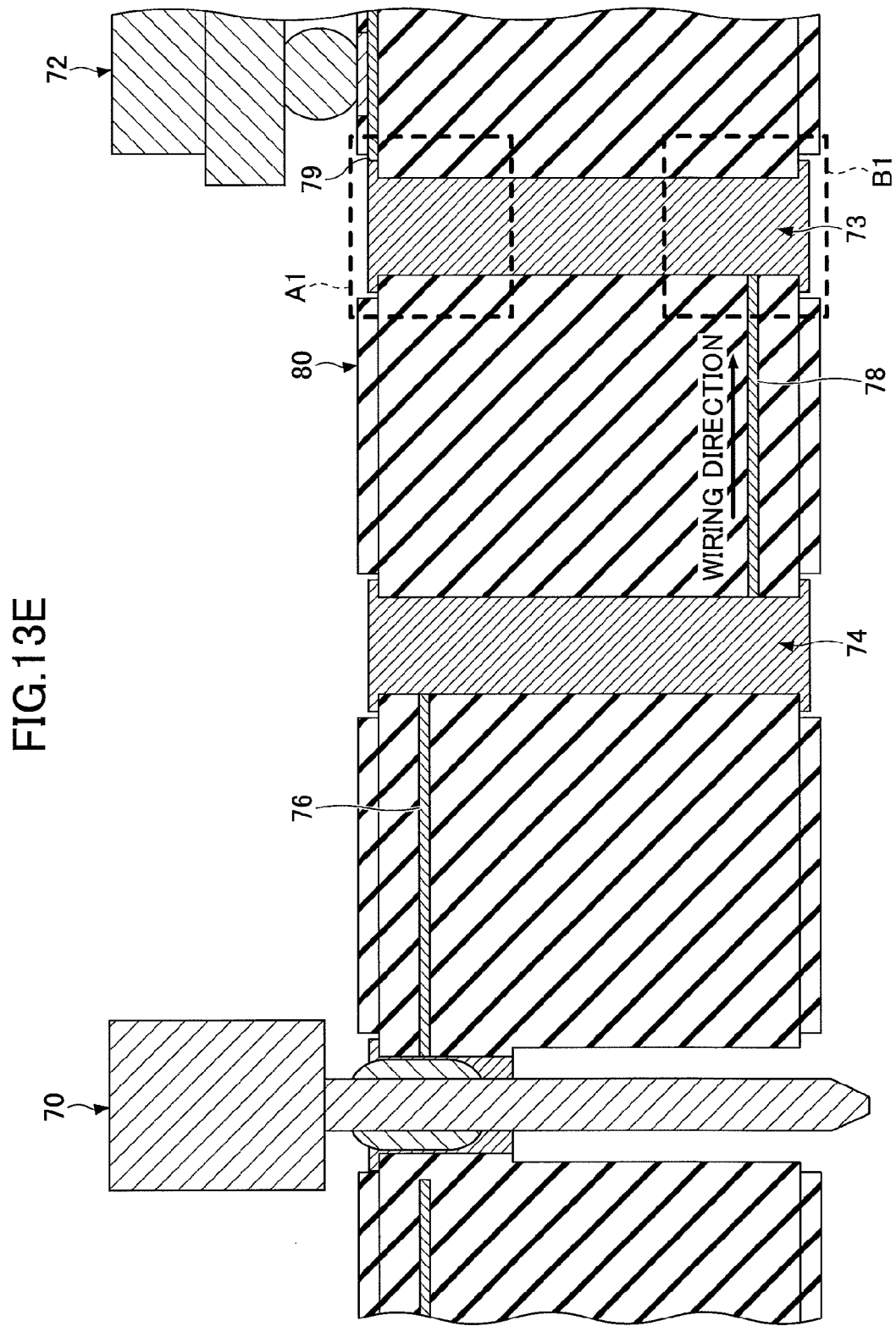
FIG. 13E is a diagram (No. 5) for illustrating an example of a design developing stage in the course of performing the wiring design illustrated in FIG. 12.

FIG. 13E is a diagram (No. 5) for illustrating an example of a design developing stage in the course of performing the wiring design illustrated in FIG. 12. The design developing stage corresponds to a stage after the wiring design content illustrated in FIG. 13D has been accepted.

A wiring design content this time is "having the wiring 78 from the inter-layer connection via hole 74 led into the SMD lead via hole 73". When the wiring design support process illustrated in FIGS. 10 and 11 in response to the input of this wiring design content, the result thereof is as follows. The determination result in step S1006 is affirmative (because of the high speed signal level "B"), the determination result in step S1014 is negative (because of "not possible" for the SMD lead via hole at the high speed signal level "B" as illustrated in FIG. 6), and the determination result in step S1016 is affirmative (because the L16 layer, which is the wiring layer, is within the back side below-limitation layer number range B1). Then, the determination result in step S1100 is affirmative (because there is the wiring 79 as an existing connected wiring), the determination result in step S1102 is affirmative (because the wiring 78 exists on the opposite side with respect to the wiring 79), the determination result in step S1108 is affirmative (because the wiring effective surface for the SMD lead via hole is the mounting back side and the wiring 79 exists on the mounting back side of the SMD lead via hole), and the current wiring design content is accepted (step S1112). In this way, leading the wiring 78 into the SMD lead via hole 73 has been designed, and the wiring design illustrated in FIG. 12 is completed.

Figure 14:
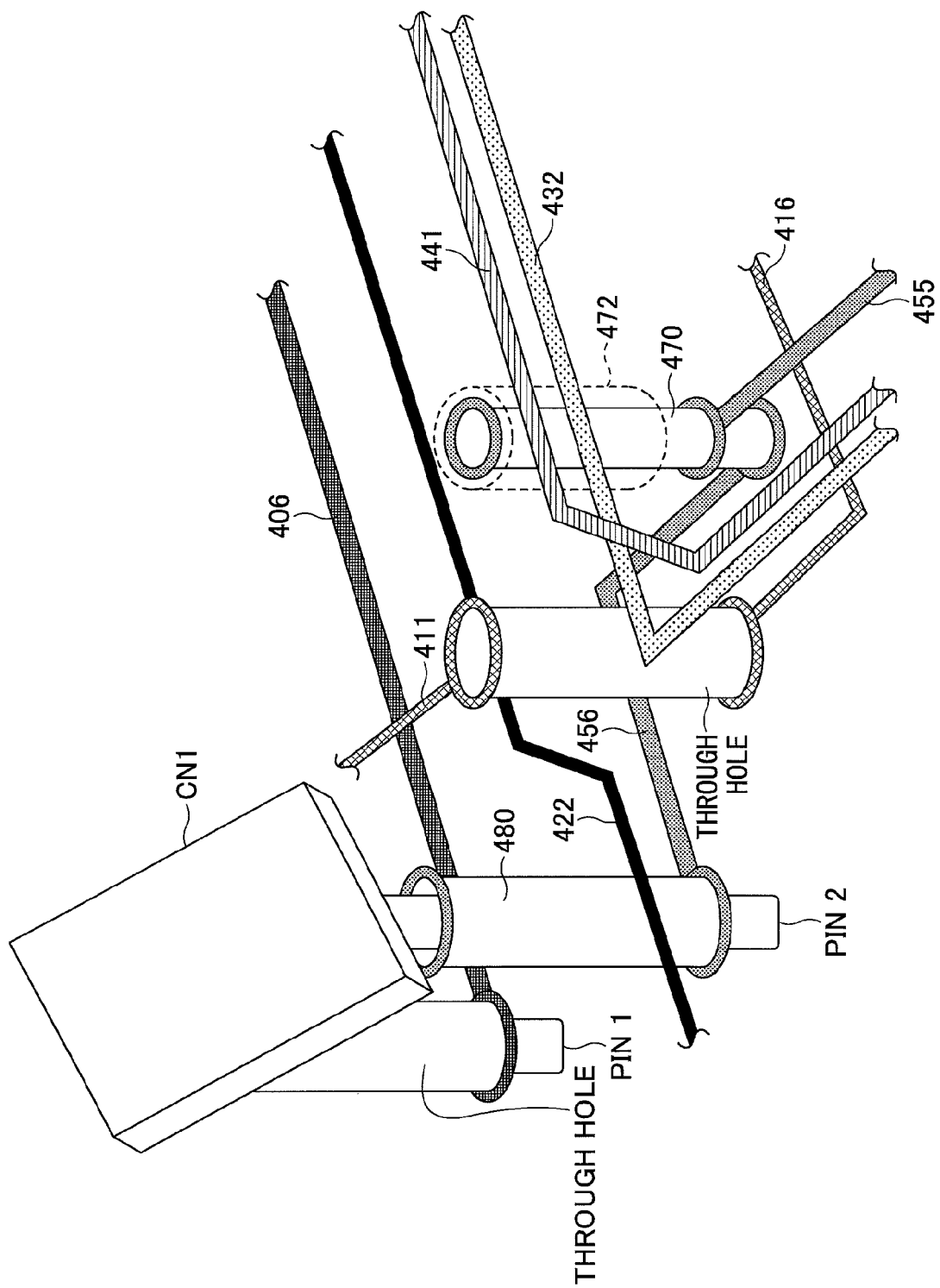
FIG. 14 is a perspective view for schematically illustrating another example of a wiring design.

Next, with reference to FIGS. 14 through 16, another example of the wiring design is explained.

FIG. 14 is a perspective view for schematically illustrating another example of the wiring design. In FIG. 14, for the sake of convenience for better visibility, only a configuration in a printed circuit board is illustrated and the illustration of the printed circuit board itself is omitted. In this example, a wiring design related to a wiring (net name 001) from a pin 2 of a part name CN1. It is assumed that the high speed signal level related to the net name 001 is "C" (see FIG. 3). In the following, a net which is different from the net of the net name 001 is referred to as "a different net".

FIG. 15A is a diagram for illustrating an example of designed wiring information which is used and updated by the wiring design illustrated in FIG. 14. The designed wiring information illustrated in FIG. 15A is an example of information included in the designed information. FIG. 15B is a diagram for illustrating an example of designed land information which is used and updated by the wiring design illustrated in FIG. 14. The designed land information illustrated in FIG. 15B is an example of information included in the designed information. It is noted that in FIGS. 15A and 15B portions indicated by satin hatching are to be added by a series of the current wire design contents for the net name 001.

FIG. 16 is a diagram for illustrating a relationship between respective wiring design contents input at the time of wiring design illustrated in FIG. 14 and respective determination results in the wiring design support process illustrated in FIGS. 10 and 11. In FIG. 16, portions indicated by satin hatching have been designed (completed) by the wire design for the net name 001. With respect to the determination results, "YES" means that the determination result is affirmative, and "NO" means that the determination result is negative.

In this example, the wire design is performed as follows. At first, the pin 2 of the part name CN1 is installed to an IMD through hole 480 (see No. 2 in FIG. 15B). A wiring from the pin 2 of the part name CN1 is the IMD (see FIGS. 2A and 2B) and the wiring effective surface is the mounting back side (see FIG. 8). Thus, the L6 layer is used to form a wiring 456 (see No. 1 and No. 2 in FIG. 15A, and a row 90 in FIG. 16). Since the different net has been designed in the L6 layer (see a wiring 416 in FIG. 14), an inter-layer connection via hole 470 is formed to change the wiring layer (see No. 4 in FIG. 15B and a row 92 in FIG. 16). Since in the L1 and L2 layers, the different nets have been designed near the inter-layer connection via hole 470 (see wirings 441 and 432 in FIG. 14), the wiring on the opposite side with respect to the wring 456 is not possible. Further, since the high speed signal level is "C" and the limitation number of the layers is "2", the wiring in the L3 or L4 layer is not possible, either (this is also because the L3 and L4 layers are solid filling layers and the layer type is inadequate, as illustrated in FIG. 4). The wiring in the L5 layer can comply with the limitation number of the layers "2"; however, it is not an opposite surface with respect to the wiring 456 which has already been connected to the inter-layer connection via hole 470, and thus the wiring in the L5 layer is not possible under present circumstances. Therefore, back drilling is applied from the L1 layer to the L4 layer (see 472 in FIG. 14, No. 4 in FIG. 15B and a row 94 in FIG. 16) so that the wiring in the L5 layer can comply with the limitation number of the layers "2". As a result of applying the back drilling, it becomes possible to use the L5 layer to lead a wiring 455 from the inter-layer connection via hole 470. Thus, the leading the wiring 455 from the inter-layer connection via hole 470 is performed (see No. 6 in FIG. 15A and a row 96 in FIG. 16).

It is noted that, as described above with reference to FIGS. 14 through 16, the wiring design support process illustrated in FIGS. 10 and 11 is configured in terms of compliance with the stab length. Thus, other wiring design requirements (such as a constraint due to the different net which exists nearby, for example) may be additionally considered by adding other determination processes.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention. Further, all or part of the components of the embodiments described above can be combined.

For example, with respect to the wiring design support process illustrated in FIGS. 10 and 11, if it is determined that exceeding the limitation value of the stab length is avoidable by applying back drilling, a user interaction may be implemented to ask the designer whether he/she desires back drilling. If the designer accepts and confirms the application of back drilling, the process may go to step S1026 after the designed information is updated accordingly. At that time, the designer may input the number of the layers to be removed by back drilling.

Further, with respect to the wiring design support process illustrated in FIGS. 10 and 11, if the back drill application table 310 indicates "necessary" in step S1014, the application of back drilling may be performed automatically (however, a message for informing such a fact may be output), and the process may go to step S1026 after the designed information is updated accordingly.

Further, in the embodiments described above, difference between the tables and libraries is not substantial, and they may be unified or divided if appropriate. For example, the back drill application table 310 and the stab length limitation value table 312 may be implemented by a single unified table.

The invention claimed is:
1. A wiring design support apparatus, comprising:
an input device with which input data about a wiring design content in a multilayered printed circuit board is input;
a storage device includes a stab length limitation value table and a back drill application table stored therein, wherein the stab length limitation value table includes set data of a limitation value about a stab length of a through hole of the printed circuit board, and the back drill application table includes set data of information about whether a conductor of a stab of the printed circuit board can be removed or not; and
a processor configured to determine, based on the stab length limitation value table and the back drill application table, whether a wiring design of the input data is appropriate.
2. The wiring design support apparatus of claim 1, wherein the limitation value about a stab length is set such that the higher a speed level of a signal to be handled becomes, the smaller the limitation value becomes.

3. The wiring design support apparatus of claim 1, wherein the processor outputs an alarm if the processor determines, based on the stab length limitation value table, that the stab length of the through hole which is to be formed by the wiring related to the input data exceeds the limitation value.

4. The wiring design support apparatus of claim 1, wherein the back drill application table further includes set data of information about which side, among a front side and a back side, a back drilling can be applied.

5. The wiring design support apparatus of claim 1, wherein if the processor determines, based on the stab length limitation value table, that the stab length of the through hole which is to be formed by the wiring related to the input data exceeds the limitation value, and determines, based on the back drill application table, that exceeding the limitation value can be prevented by a back drilling to remove the conductor of the stab, the processor outputs information for informing determination results.

6. The wiring design support apparatus of claim 1, wherein the information about whether a conductor within a stab of the printed circuit board can be removed or not is set such that it changes according to a speed level of a signal to be handled.

7. The wiring design support apparatus of claim 1, wherein the information about whether a conductor within a stab of the printed circuit board can be removed or not is set such that it changes according to a type of the through hole.

8. The wiring design support apparatus of claim 1, wherein the storage device further includes a wiring effective side table stored therein, the wiring effective side table including set data of the information about which side, among a front side and a back side, is effective for the wiring for the through hole, the information being set according to a type of the through hole, wherein
the processor configured to determine, based on the stab length limitation value table, the back drill application table and the wiring effective side table, whether the wiring design of the input data is appropriate.

9. The wiring design support apparatus of claim 8, wherein the processor outputs an alarm if the processor determines, based on the wiring effective side table, that an effective side for a type of the through hole to which the wiring of the input data is to be connected is opposite to a side of the printed circuit board on which the wiring of the input data is formed.

10. A method of supporting a wiring design, the method comprising:
inputting, to a processor, input data about a wiring design content in a multilayered printed circuit board is input; and
determining, using the processor, based on a stab length limitation value table and a back drill application table, whether a wiring design of the input data is appropriate, wherein the stab length limitation value table includes set data of a limitation value about a stab length of a through hole of the printed circuit board, and the back drill application table includes set data of information about whether a conductor of a stab can be removed or not, the information being set according to a type of the through hole.

11. A computer-readable recording medium having stored therein a program for causing a computer to execute a process, the process comprising:
obtaining input data about a wiring design content in a multilayered printed circuit board is input; and
determining, based on a stab length limitation value table and a back drill application table, whether a wiring design of the input data is appropriate, wherein the stab length limitation value table includes set data of a limitation value about a stab length of a through hole of the printed circuit board, and the back drill application table includes set data of information about whether a conductor of a stab can be removed or not, the information being set according to a type of the through hole.

* * * * *